US008858766B2

(12) United States Patent (10) Patent No.: US 8,858,766 B2
Hatcher et al. (45) Date of Patent: Oct. 14, 2014

(54) COMBINATORIAL HIGH POWER COAXIAL SWITCHING MATRIX

(75) Inventors: Brian K. Hatcher, San Jose, CA (US); Kent Riley Child, Dublin, CA (US)

(73) Assignee: Intermolecular, Inc., San Jose, CA (US)

( * ) Notice: Subject to any disclaimer, the term of this patent is extended or adjusted under 35 U.S.C. 154(b) by 41 days.

(21) Appl. No.: 13/338,102

(22) Filed: Dec. 27, 2011

(65) Prior Publication Data

US 2013/0160708 A1 Jun. 27, 2013

(51) Int. Cl.
*C23C 14/54* (2006.01)
*H01J 37/34* (2006.01)

(52) U.S. Cl.
CPC .................................. *H01J 37/3464* (2013.01)
USPC .............. 204/298.08; 204/192.12; 204/192.1; 204/157.44; 204/164; 438/687; 702/58; 118/696

(58) Field of Classification Search
CPC ..................................................... H01J 37/3464
See application file for complete search history.

(56) References Cited

U.S. PATENT DOCUMENTS

| 2004/0089535 | A1* | 5/2004  | Wolfe et al. ............... 204/192.12 |
| 2007/0082487 | A1* | 4/2007  | Chiang et al. .................. 438/687 |
| 2007/0246346 | A1* | 10/2007 | Subramani et al. ........ 204/192.1 |
| 2008/0133154 | A1* | 6/2008  | Krauss ............................ 702/58 |
| 2008/0156632 | A1* | 7/2008  | Van Zyl ........................ 204/164 |
| 2009/0026065 | A1* | 1/2009  | Nukeaw et al. .......... 204/157.44 |

* cited by examiner

*Primary Examiner* — Keith Hendricks
*Assistant Examiner* — Timon Wanga

(57) ABSTRACT

A system and method for combinatorial processing of substrates in a processing chamber. The system includes a plurality of generators for supplying power into the processing chamber. A plurality of sputter guns provides power to different regions of a substrate. A switchbox switches power from a generator to a sputter gun via a plurality of coaxial switches. A controller positioned within the switchbox automatically distributes power from a specific generator to a specific sputter gun under programmable logic control.

13 Claims, 11 Drawing Sheets

FIG. 8

| Location | | Coaxial Switch Box | | | | | | | | | Notes |
|---|---|---|---|---|---|---|---|---|---|---|---|
| Gun / Power Type Combinations | | Gun1-PDC; Gun2-PDC; Gun3-RF; Gun4-RF | Gun1-PDC; Gun2-RF; Gun3-PDC; Gun4-RF | Gun1-PDC; Gun2-RF; Gun3-RF; Gun4-PDC | Gun1-RF; Gun2-PDC; Gun3-PDC; Gun4-RF | Gun1-RF; Gun2-PDC; Gun3-RF; Gun4-PDC | Gun1-RF; Gun2-RF; Gun3-PDC; Gun4-PDC | Gun1-PDC; Gun2-PDC; Gun3-RF; Gun4-RF | Gun1-PDC; Gun2-RF; Gun3-PDC; Gun4-RF | Gun1-PDC; Gun2-RF; Gun3-RF; Gun4-PDC | 1 = Enabled 0 = Disabled |
| Gun / Power Supplies | | | | | | | | | | | |
| Gun # | Power Supply | | | | | | | | | | |
| Gun 1 | Pulse DC1 | 1 | 1 | 1 | 0 | 0 | 0 | 1 | 1 | 1 | |
| | RF1 | 0 | 0 | 0 | 1 | 1 | 1 | 0 | 0 | 0 | |
| Gun 2 | Pulse DC1 | 0 | 0 | 0 | 0 | 0 | 0 | 0 | 0 | 0 | |
| | Pulse DC2 | 1 | 0 | 0 | 1 | 1 | 0 | 0 | 0 | 0 | |
| | RF 1 | 0 | 0 | 0 | 0 | 0 | 0 | 0 | 0 | 0 | |
| | RF 2 | 0 | 1 | 1 | 0 | 0 | 1 | 1 | 1 | 1 | |
| Gun 3 | Pulse DC2 | 0 | 1 | 0 | 1 | 0 | 1 | 0 | 1 | 0 | |
| | Pulse DC3 | 0 | 0 | 0 | 0 | 0 | 0 | 0 | 0 | 0 | |
| | RF 1 | 1 | 0 | 0 | 0 | 0 | 0 | 1 | 0 | 0 | |
| | RF 2 | 0 | 0 | 1 | 0 | 1 | 0 | 0 | 0 | 1 | |
| Gun 4 | Pulse DC3 | 0 | 0 | 1 | 0 | 1 | 1 | 0 | 0 | 1 | |
| | RF 2 | 1 | 1 | 0 | 1 | 0 | 0 | 1 | 1 | 0 | |

COMBINATORIAL HIGH POWER COAXIAL SWITCHING MATRIX

FIELD OF THE INVENTION

The embodiments relate generally to a sputter deposition tool.

BACKGROUND

Combinatorial processing may refer to various techniques used to vary characteristics of the processes applied to multiple regions of a substrate in serial, parallel or parallel-serial fashion. Combinatorial processing may be used to test and compare multiple and various processing techniques. The processing techniques may be validated, and those techniques that are useful may be applied to, for example, different substrates or full-substrate processing.

During combinatorial experiments it is beneficial to provide as much flexibility as possible with regard to the tools performing the processing. For example, for processing guns requiring power, the source power cables are manually moved from one sputter gun to another depending on the power type desired for the combinatorial processing. The disconnection and reconnection of power cables creates a safety concern and is time consuming. It is within this context that the embodiments arise.

SUMMARY

The embodiments describe a high power coaxial switching matrix for combinatorial processing. In the prior art, source power cables are manually moved from one sputter gun to another depending on the power type desired. The disconnection and reconnection of power cables creates a safety concern and is time consuming. The embodiments include a matrix of high-powered coaxial switches that can connect various power types to the sputter guns. The embodiments automate the power type/sputter gun selection under software control. Power sources can be shared between sputter guns thus eliminating the need for having one power source per sputter gun. The switchbox illustrated in the drawings eliminates the need to physically move power cables from various power sources to the sputter guns, making the system safer.

In some embodiments, a system is provided for combinatorial processing of substrates in a processing chamber. The system includes a plurality of generators for supplying power into the processing chamber. A plurality of sputter guns provides power to different regions of a substrate. A switchbox switches power from a generator to a sputter gun via a plurality of coaxial switches. A controller positioned within the switchbox automatically distributes power from a specific generator to a specific sputter gun under programmable logic control.

In some embodiments, a switchbox is provided for combinatorial processing of substrates in a processing chamber. A plurality of coaxial switches are positioned within the switchbox, wherein the plurality of coaxial switches forms a switching matrix for switching power from each of a plurality of power supplies to each of a plurality of processing devices within the processing chamber. A controller positioned within the switchbox automatically distributes power from a specific power supply to a specific processing device under programmable logic control.

BRIEF DESCRIPTION OF THE DRAWINGS

FIG. 8 illustrates a coaxial switching matrix exclusion table in accordance with some embodiments of the invention.

DETAILED DESCRIPTION

Figure 1:
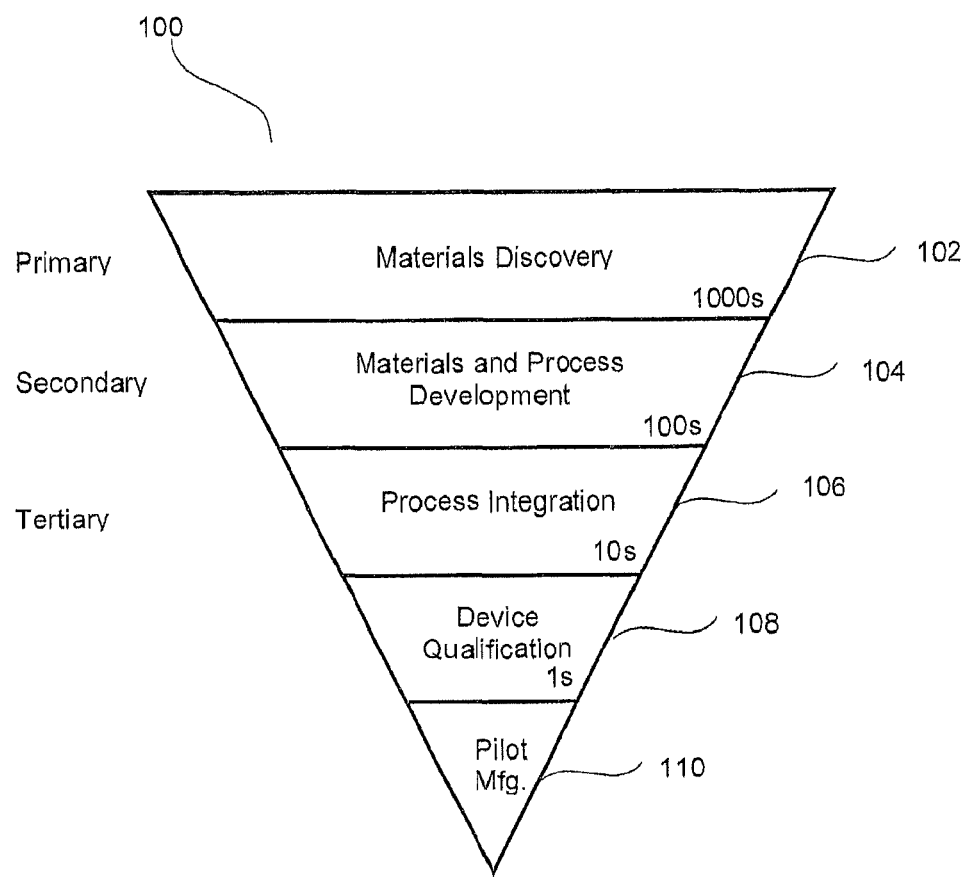
FIG. 1 illustrates a simplified schematic diagram providing an overview of the High-Productivity Combinatorial (HPC) screening process for use in evaluating materials, unit processes, and process sequences for the manufacturing of semiconductor devices in accordance with an exemplary embodiment.

The following description is provided as an enabling teaching of the invention and its best, currently known embodiments. Those skilled in the relevant art will recognize that many changes can be made to the embodiments described, while still obtaining the beneficial results. It will also be apparent that some of the desired benefits of the embodiments described can be obtained by selecting some of the features of the embodiments without utilizing other features. Accordingly, those who work in the art will recognize that many modifications and adaptations to the embodiments described are possible and may even be desirable in certain circumstances, and are a part of the invention. Thus, the following description is provided as illustrative of the principles of the embodiments of the invention and not in limitation thereof, since the scope of the invention is defined by the claims.

The embodiments described herein provide a method and apparatus related to sputter deposition processing. It will be obvious, however, to one skilled in the art, that the present invention may be practiced without some or all of these specific details. In other instances, well known process operations have not been described in detail in order not to unnecessarily obscure the present invention.

The embodiments include a matrix of high-powered coaxial switches that can connect various power types to a plurality of sputter guns. The embodiments automate the power type/sputter gun selection under software control. Power sources can be shared between sputter guns thus eliminating the need for having one power source per sputter gun. The switchbox illustrated in the embodiments eliminates the need to physically move power cables from various power sources to the sputter guns, making the system safer. The ability to automate the switching of the power supplies enhances the efficiency for performing combinatorial processing experiments where different regions of a substrate are processed according to different power levels/supplies for the sputter guns.

Semiconductor manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to (i) test different materials, (ii) test different processing conditions within each unit process module, (iii) test different sequencing and integration of processing modules within an integrated processing tool, (iv) test different sequencing of processing tools in executing different process sequence integration flows, and combinations thereof in the manufacture of devices such as integrated circuits. In particular, there is a need to be able to test (i) more than one material, (ii) more than one processing condition, (iii) more than one sequence of processing conditions, (iv) more than one process sequence integration flow, and combinations thereof, collectively known as "combinatorial process sequence integration," on a single monolithic substrate without the need for consuming the equivalent number of monolithic substrates per materials, processing conditions, sequences of processing conditions, sequences of processes, and combinations thereof. This can greatly improve both the speed and reduce the costs associated with the discovery, implementation, optimization, and qualification of materials, processes, and process integration sequences required for manufacturing.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

Systems and methods for HPC processing are described in U.S. Pat. No. 7,544,574, filed on Feb. 10, 2006; U.S. Pat. No. 7,824,935, filed on Jul. 2, 2008; U.S. Pat. No. 7,871,928, filed on May 4, 2009; U.S. Pat. No. 7,902,063, filed on Feb. 10, 2006; and U.S. Pat. No. 7,947,531, filed on Aug. 28, 2009 each of which is incorporated by reference herein. Systems and methods for HPC processing are further described in U.S. patent application Ser. No. 11/352,077, filed on Feb. 10, 2006; U.S. patent application Ser. No. 11/419,174, filed on May 18, 2006; U.S. patent application Ser. No. 11/674,132, filed on Feb. 12, 2007; and U.S. patent application Ser. No. 11/674,137, filed on Feb. 12, 2007. The aforementioned patent applications claim priority from provisional patent application 60/725,186 filed Oct. 11, 2005. Each of the aforementioned patent applications and the provisional patent application are incorporated by reference herein.

FIG. 1 illustrates a schematic diagram 100 for implementing combinatorial processing and evaluation using primary, secondary, and tertiary screening. The schematic diagram 100 illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage 102. Materials discovery stage 102 is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage 104. Evaluation of the materials is performed using metrology tools such as electronic testers and imaging tools (e.g., microscopes).

The materials and process development stage 104 may evaluate hundreds of materials (i.e., a magnitude smaller than the primary stage) and may focus on the processes used to deposit or develop those materials. Promising materials and processes are again selected, and advanced to the tertiary screen or process integration stage 106 where tens of materials and/or processes and combinations are evaluated. The tertiary screen or process integration stage 106 may focus on integrating the selected processes and materials with other processes and materials.

The most promising materials and processes from the tertiary screen are advanced to device qualification 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing 110.

The schematic diagram 100 is an example of various techniques that may be used to evaluate and select materials and processes for the development of new materials and processes. The descriptions of primary, secondary, etc. screening and the various stages 102-110 are arbitrary and the stages may overlap, occur out of sequence, be described and be performed in many other ways.

This application benefits from High Productivity Combinatorial (HPC) techniques described in U.S. patent application Ser. No. 11/674,137, filed on Feb. 12, 2007, which is hereby incorporated by reference in its entirety. Portions of the '137 application have been reproduced below to enhance the understanding of the embodiments disclosed herein. The embodiments disclosed enable the application of combinatorial techniques to process sequence integration in order to arrive at a globally optimal sequence of semiconductor manufacturing operations by considering interaction effects between the unit manufacturing operations, the process conditions used to effect such unit manufacturing operations, hardware details used during the processing, as well as material characteristics of components utilized within the unit manufacturing operations. Rather than only considering a series of local optimums, i.e., where the best conditions and materials for each manufacturing unit operation is considered in isolation, the embodiments described below consider effects of interactions introduced due to the multitude of processing operations that are performed and the order in which such multitude of processing operations are performed when fabricating a device. A global optimum sequence order is therefore derived, and as part of this derivation, the unit processes, unit process parameters, and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the semiconductor device. For example, such structures may include, but would not be limited to, contact layers, buffer layers, absorber layers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform throughout each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameters (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
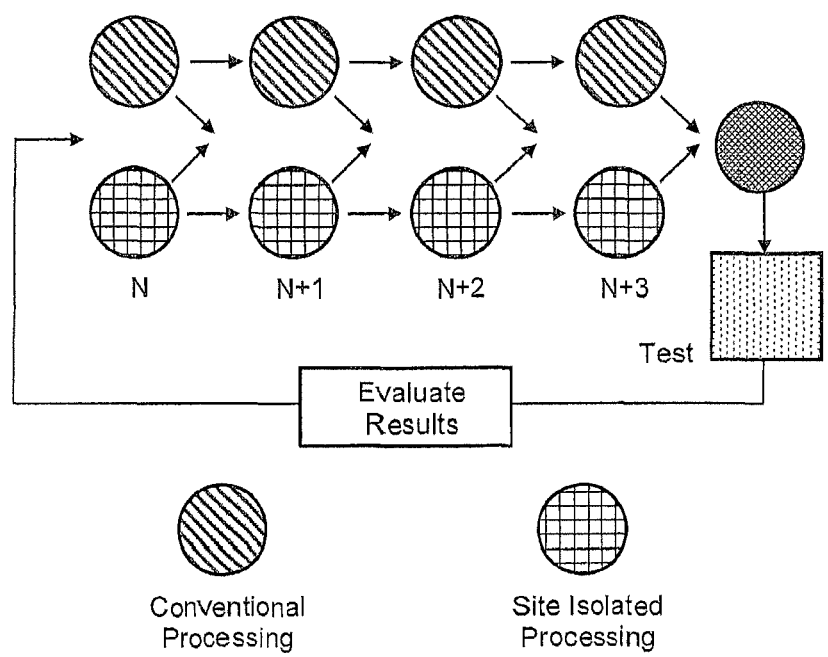
FIG. 2 illustrates a flowchart of a general methodology for combinatorial process sequence integration that includes site-isolated processing and/or conventional processing in accordance with an exemplary embodiment.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g., from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments described herein perform the processing locally in a conventional manner, i.e., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3:
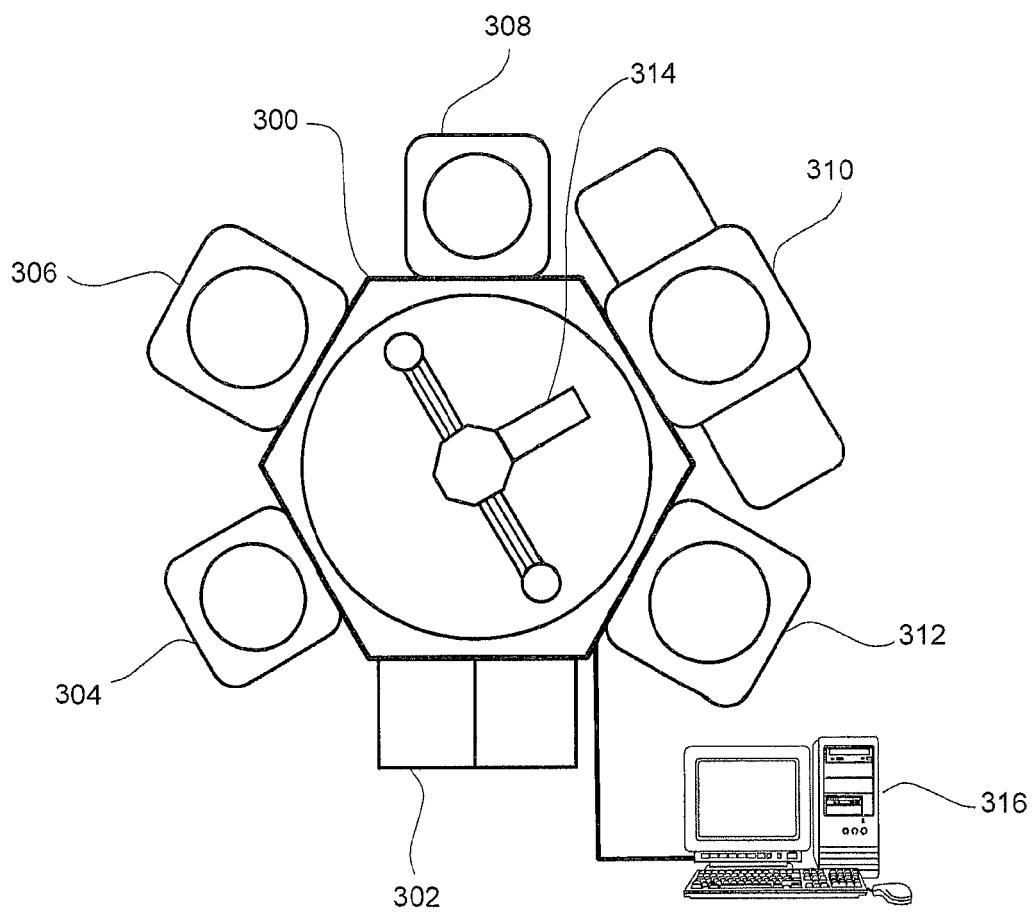
FIG. 3 illustrates an integrated high productivity combinatorial (HPC) system in accordance with some embodiments of the invention

FIG. 3 is a simplified schematic diagram illustrating an integrated high productivity combinatorial (HPC) system in accordance with some embodiments of the invention. HPC system includes a frame 300 supporting a plurality of processing modules. It should be appreciated that frame 300 may be a unitary frame in accordance with some embodiments. In some embodiments, the environment within frame 300 is controlled. Load lock/factory interface 302 provides access into the plurality of modules of the HPC system. Robot 314 provides for the movement of substrates (and masks) between the modules and for the movement into and out of the load lock 302. Modules 304-312 may be any set of modules and preferably include one or more combinatorial modules. For example, module 304 may be an orientation/degassing module, module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 316, may control the processes of the HPC system, including the power supplies and synchronization of the duty cycles described in more detail below. Further details of one possible HPC system are described in U.S. application Ser. Nos. 11/672,478 and 11/672,473. With the HPC system, a plurality of methods may be employed to deposit material upon a substrate employing combinatorial processes.

Figure 4:
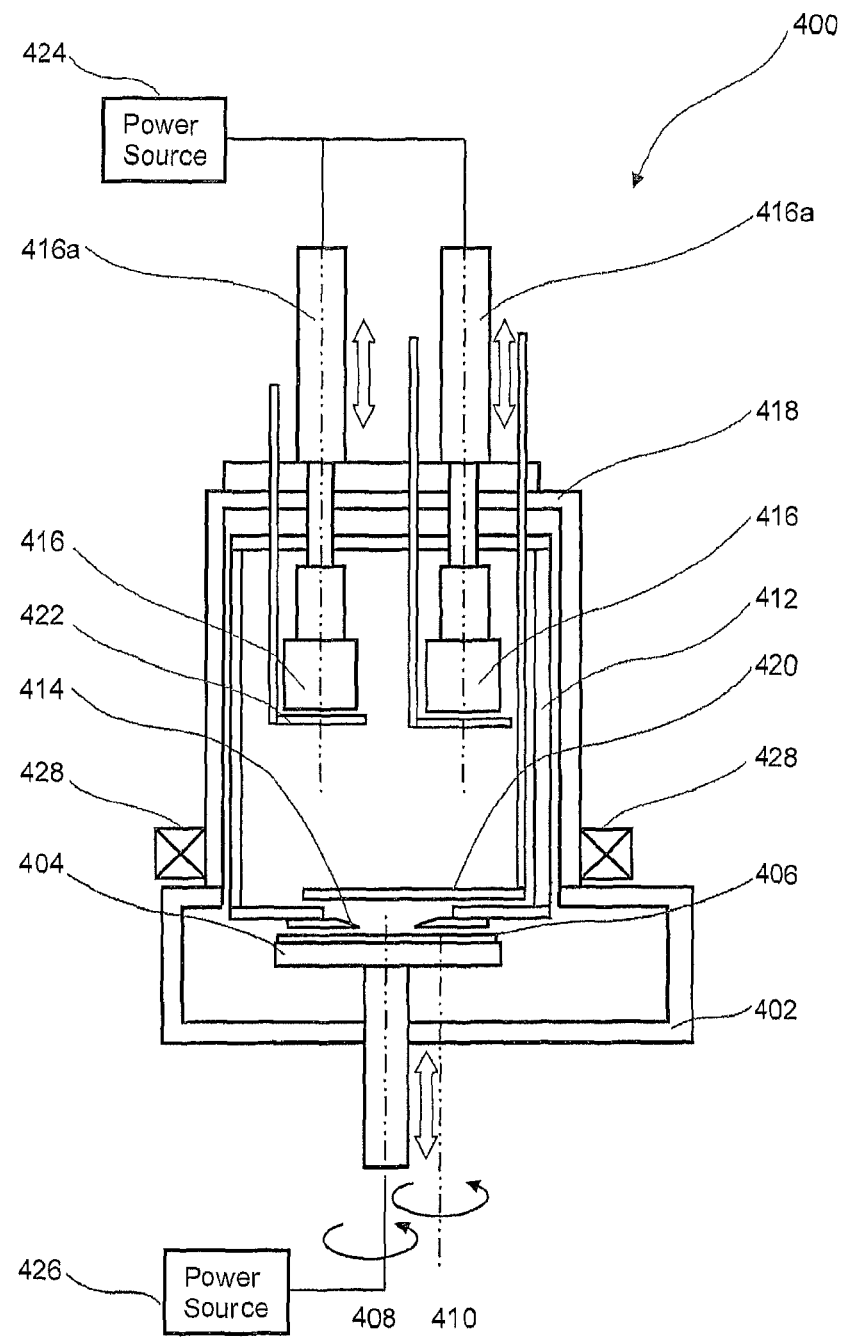
FIG. 4 illustrates a sputter chamber configured to perform combinatorial processing and full substrate processing in accordance with some embodiments of the invention.

FIG. 4 is a simplified schematic diagram illustrating a sputter chamber configured to perform combinatorial processing and full substrate processing in accordance with some embodiments of the invention. Processing chamber 400 includes a bottom chamber portion 402 disposed under top chamber portion 418. Within bottom portion 402, substrate support 404 is configured to hold a substrate 406 disposed thereon and can be any known substrate support, including but not limited to a vacuum chuck, electrostatic chuck or other known mechanisms. Substrate support 404 is capable of both rotating around its own central axis 408 (referred to as "rotation" axis), and rotating around an exterior axis 410 (referred to as "revolution" axis). Such dual rotary substrate support is central to combinatorial processing using site-isolated mechanisms. Other substrate supports, such as an XY table, can also be used for site-isolated deposition. In addition, substrate support 404 may move in a vertical direction. It should be appreciated that the rotation and movement in the vertical direction may be achieved through known drive mechanisms which include magnetic drives, linear drives, worm screws, lead screws, a differentially pumped rotary feed through drive, etc. Power source 426 provides a bias power to substrate support 404 and substrate 406, and produces a negative bias voltage on substrate 406. In some embodiments, power source 426 provides a radio frequency (RF) power sufficient to take advantage of the high metal ionization to improve step coverage of vias and trenches of patterned wafers. In another embodiment, the RF power supplied by power source 426 is pulsed and synchronized with the pulsed power from power source 424. Further details of the power sources and their operation may be found in U.S. patent application Ser. No. 13/281,316 entitled "High Metal Ionization Sputter Gun" filed on Oct. 25, 2011 and is incorporated by reference herein.

Substrate 406 may be a conventional round 200 mm, 300 mm, or any other larger or smaller substrate/wafer size. In other embodiments, substrate 406 may be a square, rectangular, or other shaped substrate. One skilled in the art will appreciate that substrate 406 may be a blanket substrate, a coupon (e.g., partial wafer), or even a patterned substrate having predefined regions. In another embodiment, substrate 406 may have regions defined through the processing described herein. The term region is used herein to refer to a localized area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field a region may be, for example, a test structure, single die, multiple dies, portion of a die, other defined portion of substrate, or an undefined area of a substrate, e.g., blanket substrate which is defined through the processing.

Top chamber portion 418 of chamber 400 in FIG. 4 includes process kit shield 412, which defines a confinement region over a radial portion of substrate 406. Process kit shield 412 is a sleeve having a base (optionally integrated with the shield) and an optional top within chamber 400 that may be used to confine a plasma generated therein. The generated plasma will dislodge atoms from a target and the sputtered atoms will deposit on an exposed surface of substrate 406 to combinatorial process regions of the substrate in some embodiments. In another embodiment, full wafer processing can be achieved by optimizing gun tilt angle and target-to-substrate spacing, and by using multiple process guns 416. Process kit shield 412 is capable of being moved in and out of chamber 400, i.e., the process kit shield is a replaceable insert. In another embodiment, process kit shield 412 remains in the chamber for both the full substrate and combinatorial processing. Process kit shield 412 includes an optional top portion, sidewalls and a base. In some embodiments, process kit shield 412 is configured in a cylindrical shape, however, the process kit shield may be any suitable shape and is not limited to a cylindrical shape.

The base of process kit shield 412 includes an aperture 414 through which a surface of substrate 406 is exposed for deposition or some other suitable semiconductor processing operations. Aperture shutter 420 is moveably disposed over the base of process kit shield 412. Aperture shutter 420 may slide across a bottom surface of the base of process kit shield 412 in order to cover or expose aperture 414 in some embodiments. In another embodiment, aperture shutter 420 is controlled through an arm extension which moves the aperture shutter to expose or cover aperture 414. It should be noted that although a single aperture is illustrated, multiple apertures may be included. Each aperture may be associated with a dedicated aperture shutter or an aperture shutter can be configured to cover more than one aperture simultaneously or separately. Alternatively, aperture 414 may be a larger opening and plate 420 may extend with that opening to either completely cover the aperture or place one or more fixed apertures within that opening for processing the defined regions. The dual rotary substrate support 404 is central to the site-isolated mechanism, and allows any location of the substrate or wafer to be placed under the aperture 414. Hence, the site-isolated deposition is possible at any location on the wafer/substrate.

A gun shutter 422 may be included. Gun shutter 422 functions to seal off a deposition gun when the deposition gun may not be used for the processing in some embodiments. For example, two process guns 416 are illustrated in FIG. 4. Process guns 416 are moveable in a vertical direction so that one or both of the guns may be lifted from the slots of the shield. While two process guns are illustrated, any number of process guns may be included, e.g., one, three, four or more process guns may be included. Where more than one process gun is included, the plurality of process guns may be referred to as a cluster of process guns. Gun shutter 422 can be transitioned to isolate the lifted process guns from the processing area defined within process kit shield 412. In this manner, the process guns are isolated from certain processes when desired. It should be appreciated that slide cover plate 422 may be integrated with the top of the process kit shield 412 to cover the opening as the process gun is lifted or individual cover plate 422 can be used for each target. In some embodiments, process guns 416 are oriented or angled so that a normal reference line extending from a planar surface of the target of the process gun is directed toward an outer periphery of the substrate in order to achieve good uniformity for full substrate deposition film. The target/gun tilt angle depends on the target size, target-to-substrate spacing, target material, process power/pressure, etc.

Top chamber portion 418 of chamber 400 of FIG. 4 includes sidewalls and a top plate which houses process kit shield 412. Arm extensions 416a, which are fixed to process guns 416 may be attached to a suitable drive, e.g., lead screw, worm gear, etc., configured to vertically move process guns 416 toward or away from a top plate of top chamber portion 418. Arm extensions 416a may be pivotally affixed to process guns 416 to enable the process guns to tilt relative to a vertical axis. In some embodiments, process guns 416 tilt toward aperture 414 when performing combinatorial processing and tilt toward a periphery of the substrate being processed when performing full substrate processing. It should be appreciated that process guns 416 may tilt away from aperture 414 when performing combinatorial processing in another embodiment. In yet another embodiment, arm extensions 416a are attached to a bellows that allows for the vertical movement and tilting of process guns 416. Arm extensions 416a enable movement with four degrees of freedom in some embodiments. Where process kit shield 412 is utilized, the aperture openings are configured to accommodate the tilting of the process guns. The amount of tilting of the process guns may be dependent on the process being performed in some embodiments.

Power source 424 provides power for sputter guns 416 whereas power source 426 provides RF bias power to an electrostatic chuck to bias the substrate when necessary. It should be appreciated that power source 424 may output a direct current (DC) power supply or a radio frequency (RF) power supply. The embodiments described with reference to FIGS. 5-11 below illustrate an apparatus for enabling the ability to efficiently switch power sources to the appropriate receiver of the power source, such as sputter guns 416 or the electrostatic chuck in some embodiments.

Chamber 400 of FIG. 4 includes auxiliary magnet 428 disposed around an external periphery of the chamber. The auxiliary magnet 428 is located in a region defined between the bottom surface of sputter guns 416 and a top surface of substrate 406. Magnet 428 may be either a permanent magnet or an electromagnet. It should be appreciated that magnet 428 is utilized to provide more uniform bombardment of argon ions and electrons to the substrate in some embodiments.

Figure 5:
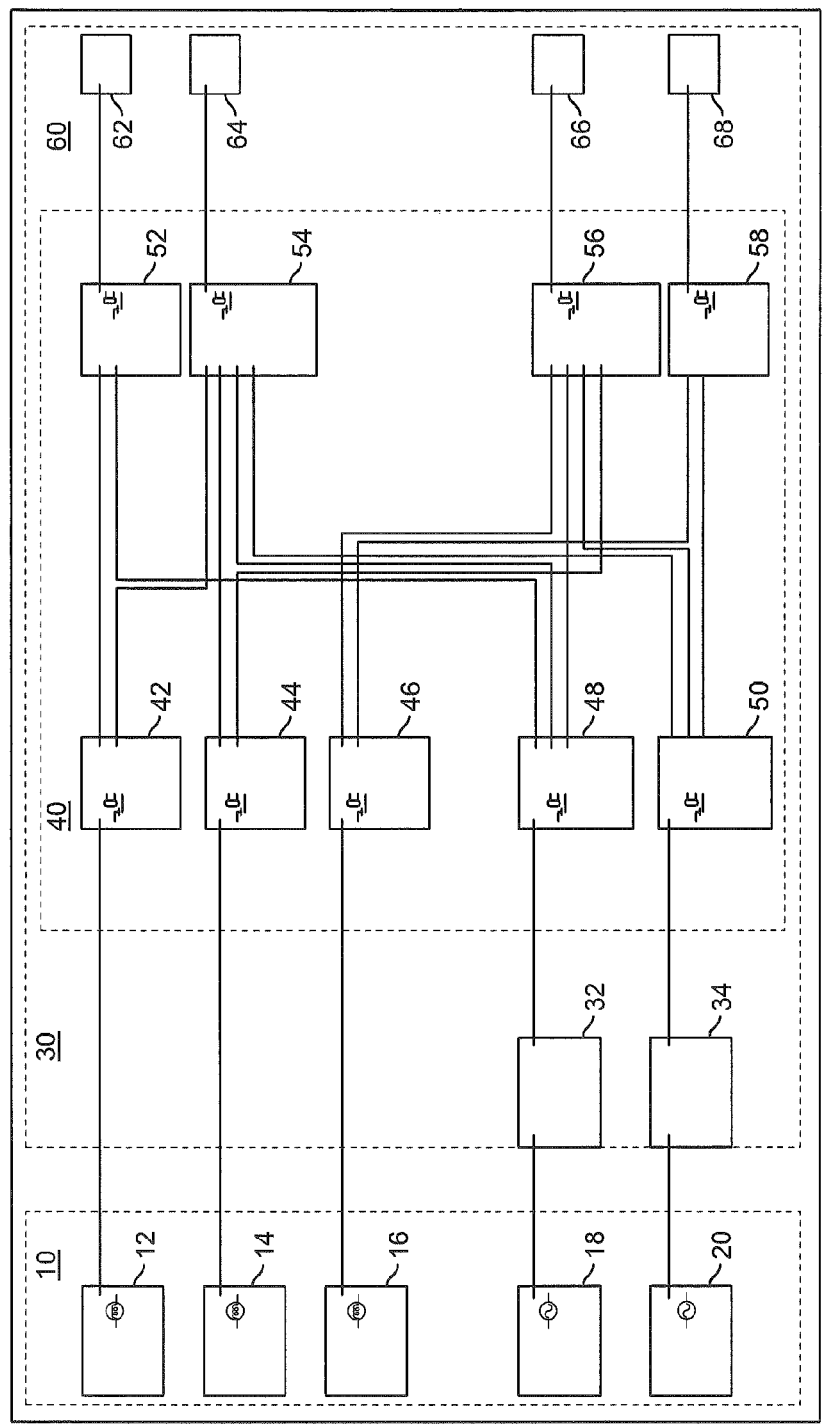
FIG. 5 illustrates coaxial connections for the switching matrix for switching power from a plurality of generators to a plurality of sputter guns in accordance with some embodiments of the invention.

In some embodiments, a matrix of high-powered coaxial switches ("switching matrix") enables connection of various power types to sputter guns through software control. FIG. 5 illustrates coaxial connections for the switching matrix in accordance with some embodiments of the invention. Processing chamber 30 can include switchbox 40 and a plurality of sputter guns 62-68. Power to the plurality of sputter guns can be provided via the switchbox 40 from generator rack 10 which can include a plurality of generators 12, 14, 16, 18, 20. In the exemplary embodiment shown, generators 12, 14, and 16 are 208 volts AC, three phase commercial pulse generators that provide a direct current output to coaxial switches 42, 44, and 46, respectively. Switchbox 40 includes a plurality of coaxial switches 42-58 for switching power supplied by the plurality of generators to the plurality of sputter guns 62-68. A coaxial switch is an electromechanical relay that is used to direct applied power signals from one path to another path. Coaxial switch configurations are identified by number of input ports (poles) and the number of output ports (throws). Coaxial switches are selected based on the number of paths to be routed. In this exemplary embodiment, coaxial switches 42, 44, 46, 52, and 58 are single pole-double throw (SPDT) switches; coaxial switches 48, 50 are single pole-triple throw switches (SP3T); and coaxial switches 54, 56 are single pole-four throw (SP4T) switches. In other embodiments, it should be appreciated that more or fewer generators, coaxial switches, and sputter guns can be utilized.

In the embodiment of FIG. 5, and as summarized in the Table 1 below, pulse direct current (PDC) generators 12, 14, 16 can route DC power to SPDT coaxial switches 42, 44, 46, respectively. Coaxial switch 42 provides connection paths to coaxial switches 52, 54 which switches power from PDC 1 generator 12 to sputter gun 1 (62) and sputter gun 2 (64), respectively. Coaxial switch 44 provides connection paths to coaxial switches 54, 56 which switches power from PDC 2 generator 14 to sputter gun 2 (64) and sputter gun 3 (66), respectively. Coaxial switch 46 provides connection paths to coaxial switches 56, 58 which switches power from PDC 3 generator 16 to sputter gun 3 (66) and sputter gun 4 (68), respectively. In this exemplary embodiment, RF generators 18, 20 can route 600 watts of power at 13.56 MHz to SP3T coaxial switches 48, 50, respectively through match capacitors 32, 34, respectively. Coaxial switch 48 provides connection paths to coaxial switches 52, 54, 56 which switches power from RF 1 generator 18 to sputter gun 1 (62), sputter gun 2 (64), and sputter gun 3 (66), respectively. Coaxial switch 50 provides connection paths to coaxial switches 54, 56, 58 which switches power from RF 2 generator 20 to sputter gun 2 (64), sputter gun 3 (66), and sputter gun 4 (68), respectively.

TABLE 1

| Generator (ref. no) | Match Capacitor (ref no.) | Coaxial Switches (first, second) | Sputter Guns (ref no.) |
|---|---|---|---|
| PDC 1 (12) | Not applicable (N/A) | 42, 52 | Gun 1 (62) |
|  |  | 42, 54 | Gun 2 (64) |
| PDC 2 (14) | N/A | 44, 54 | Gun 2 (64) |
|  |  | 44, 56 | Gun 3 (66) |
| PDC 3 (16) | N/A | 46, 56 | Gun 3 (66) |
|  |  | 46, 58 | Gun 4 (68) |
| RF 1 (18) | 32 | 48, 52 | Gun 1 (62) |
|  |  | 48, 54 | Gun 2 (64) |
|  |  | 48, 56 | Gun 3 (66) |
| RF 2 (20) | 34 | 50, 54 | Gun 2 (64) |
|  |  | 50, 56 | Gun 3 (66) |
|  |  | 50, 58 | Gun 4 (68) |

Figure 6:
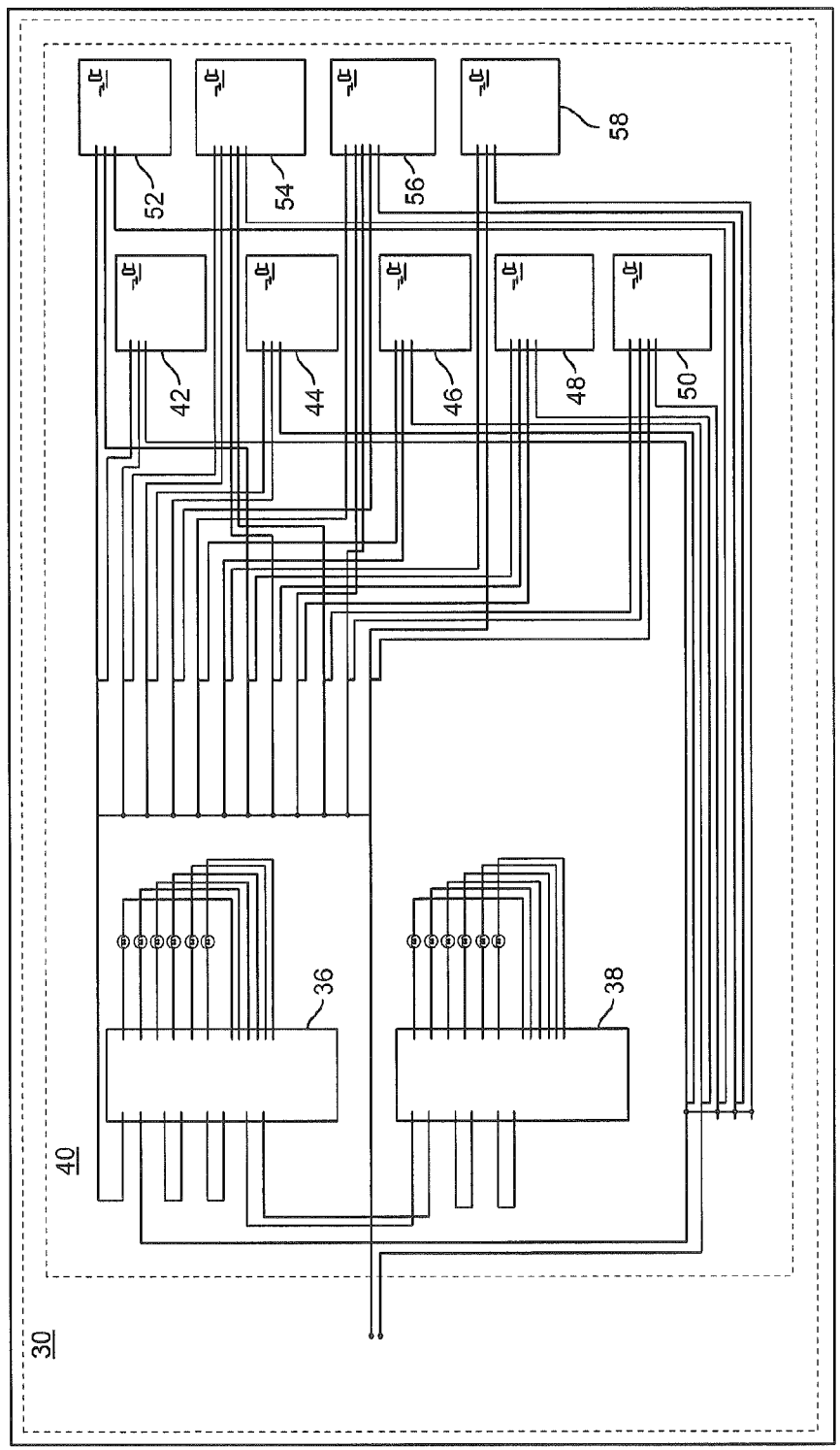
FIG. 6 illustrates controller safety slave devices and relay connections for the switching matrix in accordance with some embodiments of the invention.
Figure 7:
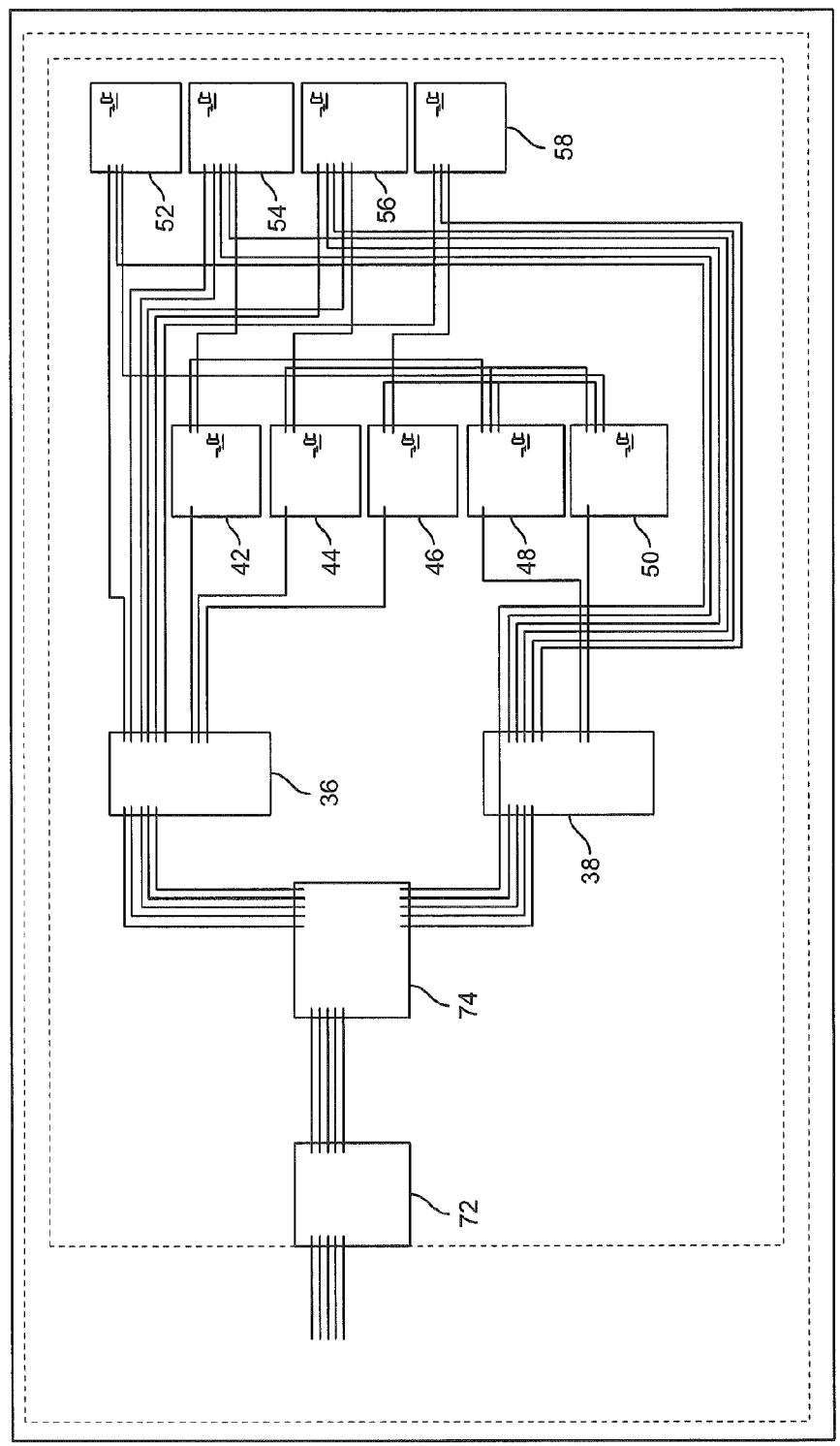
FIG. 7 illustrates indicator connections for the switching matrix in accordance with some embodiments of the invention.

In some embodiments, the controller controls relay connections to the plurality of coaxial switches in the switching matrix. FIG. 6 illustrates controller safety slave devices 36, 38 that can control relay connections to coaxial connectors 42-68 for the switchbox 40 in accordance with some embodiments. In some embodiments, both controller safety slave devices 36, 38 have eight safety-rated inputs and eight safety-rated outputs. FIG. 7 illustrates indicator connections for the coaxial switches in the switching matrix in some embodiments. FIG. 7 provides feedback on the coaxial switch positions indicating the positions of the coaxial switches via feed through devices 72, 74.

In some embodiments, the controller is a programmable logic controller providing switching logic to control distribution of RF and pulsed DC power from a plurality of power supplies to a plurality of sputter guns. FIG. 8 illustrates a coaxial switching matrix exclusion table in accordance with some embodiments of the invention. The combination of gun and power supply is shown in the rows of the matrix. The settings of the guns and power supplies via the coaxial switchbox 40 are shown in the columns of the matrix. The Boolean values in the matrix indicate whether an available gun/power supply combination is enabled (value=1) or disabled (value=zero). For example, in the first column settings, power supply PDC 1 is enabled for gun 1, power supply PDC 2 is enabled for gun 2, power supply RF 1 is enabled for gun 3, and power supply RF 2 is enabled for gun 4. It should be appreciated that the tabulated data of FIG. 8 is exemplary and not meant to be limiting as the configuration of the switches and the logic settings for enabling and disabling may utilize different combinational logic and switch configuration.

Figure 9:
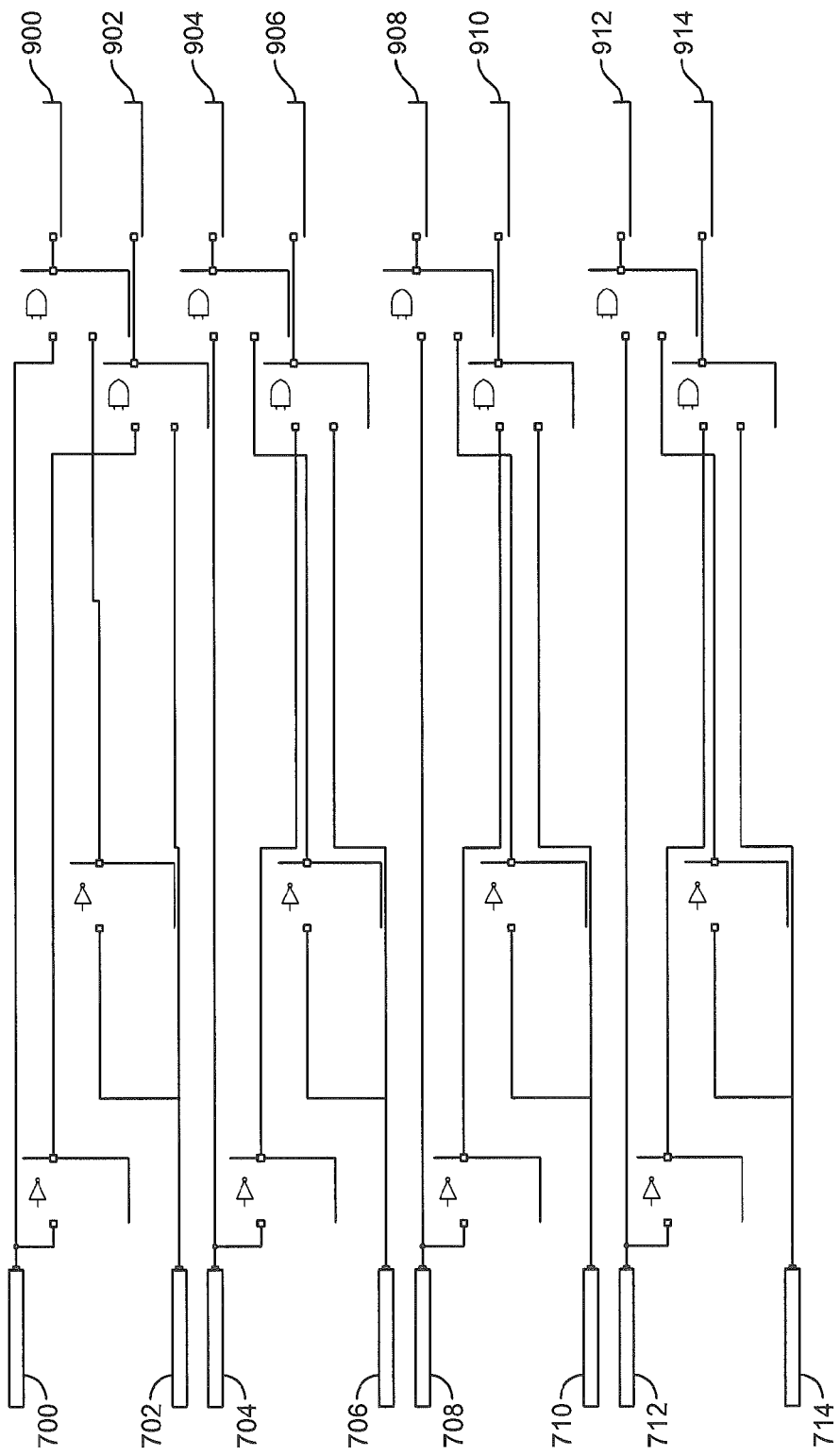
FIG. 9 illustrates PDC/RF power supplies exclusion logic in accordance with some embodiments of the invention.
Figure 10:
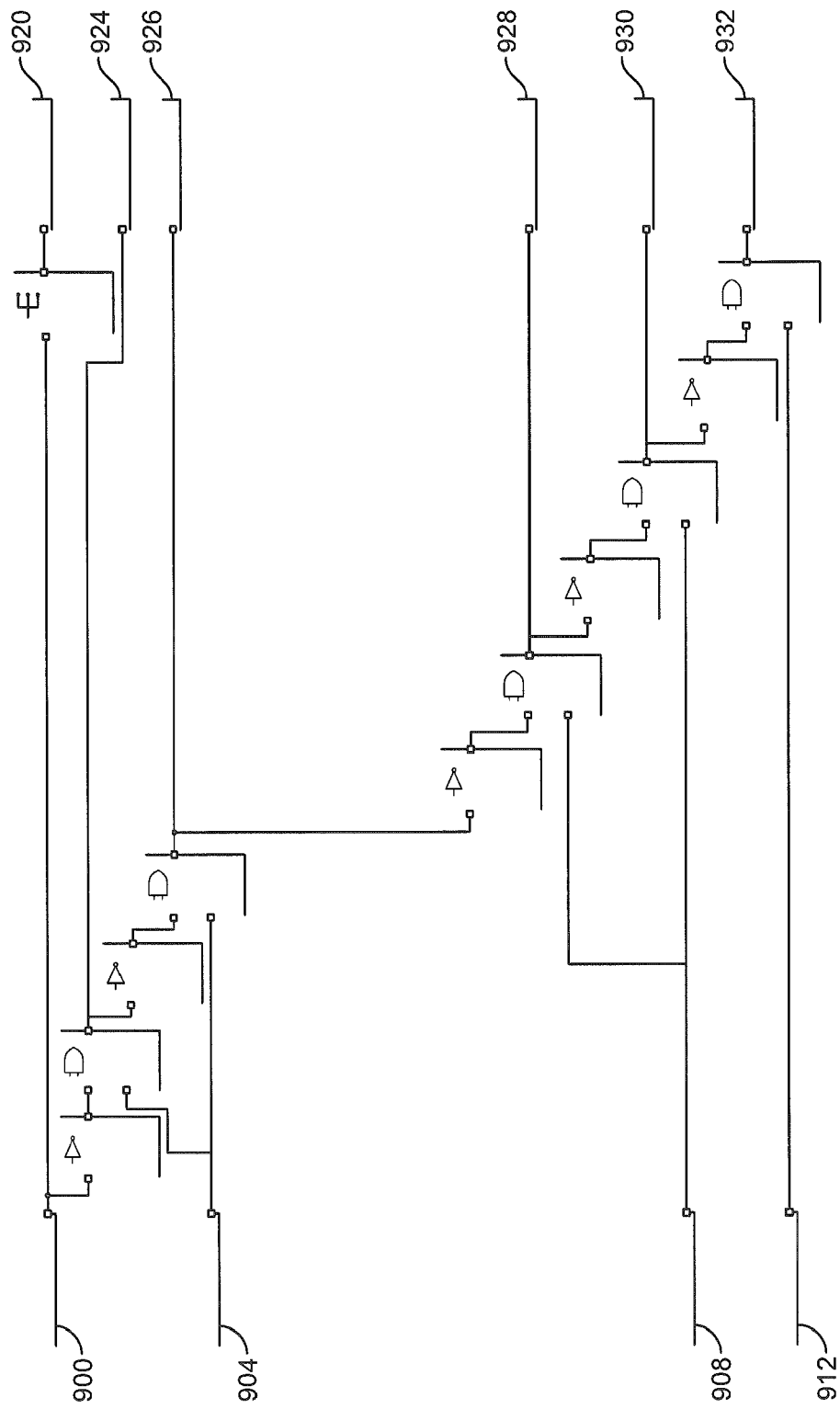
FIG. 10 illustrates PDC power supplies exclusion logic in accordance with some embodiments of the invention.
Figure 11:
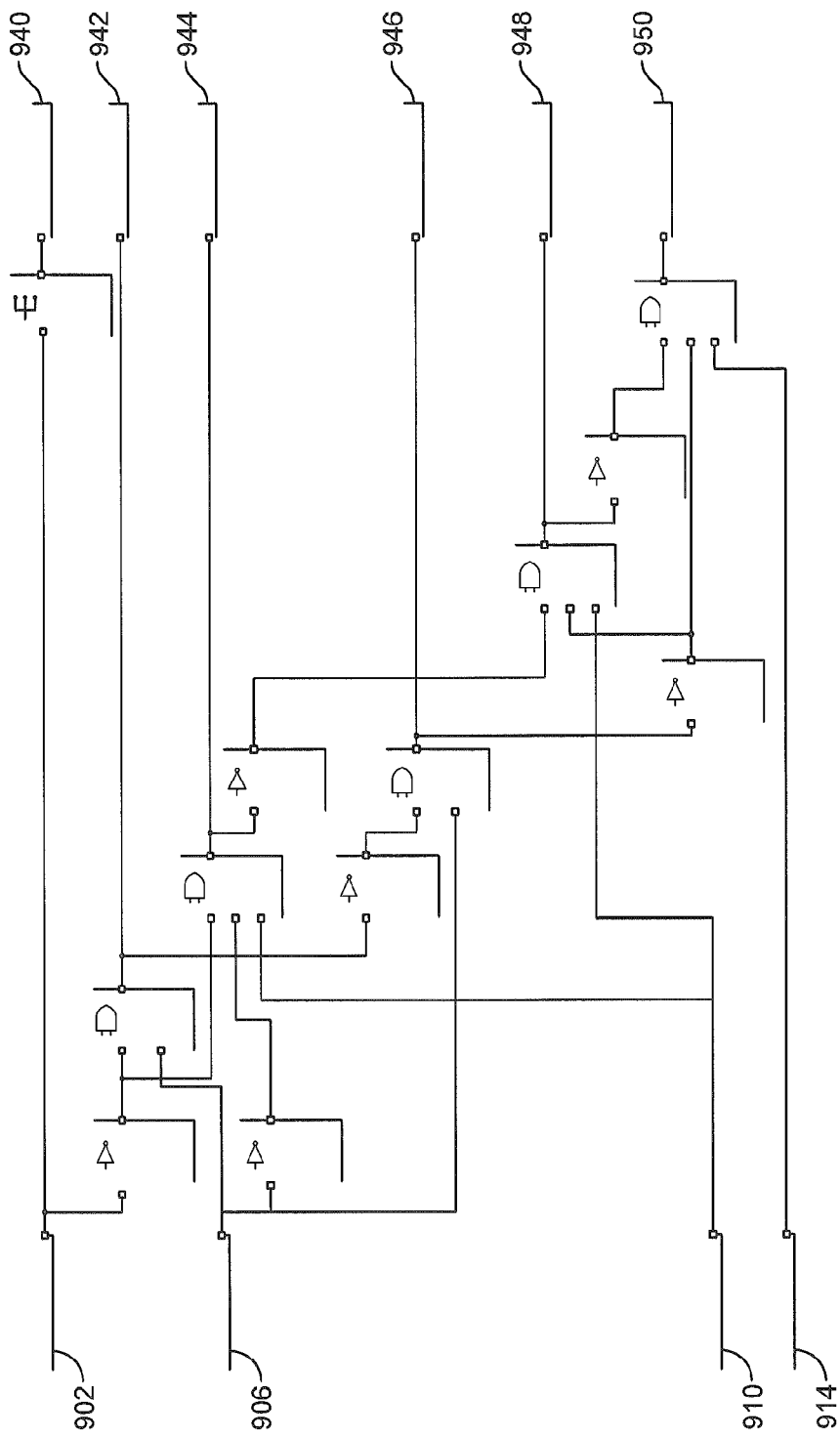
FIG. 11 illustrates RF power supplies exclusion logic in accordance with some embodiments of the invention.

FIGS. 9-11 illustrate the PDC/RF power supply exclusion logic programmed into the programmable logic controller (PLC) which controls switchbox 40. FIG. 9 illustrates PDC/RF power supplies exclusion logic provided via a plurality of inverter (NOT) gates and AND gates in accordance with some embodiments. In the embodiments of FIGS. 9-11, each of the sputter guns can be enabled for either Pulse DC (PDC) or RF power. The inputs 700-714 to the exclusion logic of FIG. 9 represent signals to enable PDC or RF power to each sputter gun via the coaxial switches in the switching matrix. The outputs from the exclusion logic of FIG. 9 are a plurality of enable lines 900-914 for enabling PDC power or RF power for each gun via the coaxial switches in the switching matrix. The logic for enabling PDC power to gun 1 (900), gun 2 (904), gun 3 (908), and gun 4 (912) continues in FIG. 10 which illustrates PDC power supplies exclusion logic in an exemplary embodiment. Gun 1 is enabled for PDC 1 power, via the switching matrix, by the input signal on line 920. Gun 2 is enabled for PDC 1 power, via the switching matrix, by the input signal on line 924 and for PDC 2 power, via the switching matrix, by the input signal on line 926. Gun 3 is enabled for PDC 1 power, via the switching matrix, by the input signal on line 930 and for PDC 2 power, via the switching matrix, by the input signal on line 928. Gun 4 is enabled for PDC 3 power, via the switching matrix, by the input signal on line 932.

The logic for enabling RF power to gun 1 (902), gun 2 (906), gun 3 (910), and gun 4 (914) continues in FIG. 11 which illustrates RF power supplies exclusion logic in accordance with some embodiments of the invention. Gun 1 is enabled for RF 1 power, via the switching matrix, by the input signal on line 940. Gun 2 is enabled for RF 1 power, via the switching matrix, by the input signal on line 942 and for RF 2 power, via the switching matrix, by the input signal on line 946. Gun 3 is enabled for RF 1 power, via the switching matrix, by the input signal on line 944 and for RF 2 power, via the switching matrix, by the input signal on line 948. Gun 4 is enabled for RF 2 power, via the switching matrix, by the input signal on line 950.

The corresponding structures, materials, acts, and equivalents of all means plus function elements in any claims below are intended to include any structure, material, or acts for performing the function in combination with other claim elements as specifically claimed.

Those skilled in the art will appreciate that many modifications to the exemplary embodiments are possible without departing from the scope of the present invention. In addition, it is possible to use some of the features of the embodiments disclosed without the corresponding use of the other features. Accordingly, the foregoing description of the exemplary embodiments is provided for the purpose of illustrating the principles of the invention, and not in limitation thereof, since the scope of the invention is defined solely by the appended claims.

What is claimed:

1. A system for combinatorial processing of a substrate in a processing chamber, comprising:
a shield disposed within the chamber, wherein the shield comprises an aperture, wherein the aperture is configured to define site isolated regions on the surface of the substrate;
a plurality of independent power generators, each power generator having a corresponding output power port;
a plurality of sputter guns configured to provide sputtered material on to the site isolated regions of the surface of the substrate;
a switchbox comprising a plurality of switchbox input ports, a plurality of switchbox output ports, and a plurality of coaxial switches configured to selectively deliver power from at least one of the plurality of generators to at least one of the plurality of sputter guns; and
a controller positioned within the switchbox configured to selectively deliver power from a specific generator to a specific sputter gun under programmable logic control;
wherein each output power port of the plurality of generators is connected to a single corresponding switchbox input port, and each of the plurality of sputter guns is connected to a single corresponding switchbox output; and
wherein each coaxial switch is one of a single pole-double throw switch, a single pole-triple throw switch, or a single pole-four throw switch.

2. The system for combinatorial processing of claim 1 wherein the plurality of generators comprises at least one pulse direct current (PDC) generator.

3. The system for combinatorial processing of claim 1 wherein the plurality of generators comprises at least one radio frequency (RF) generator.

4. The system for combinatorial processing of claim 1 wherein the plurality of generators comprises at least one pulse direct current generator and at least one radio frequency (RF) generator.

5. The system for combinatorial processing of claim 2 wherein the at least one PDC generator supplies power at a voltage of about 208 volts.

6. The system for combinatorial processing of claim 3 wherein the at least one RF generator supplies power of about 600 watts at a frequency of about 13.56 MHz.

7. The system for combinatorial processing of claim 1 wherein each sputter gun is enabled for pulsed direct current (PDC) power or radio frequency (RF) power under programmable logic control.

8. The system for combinatorial processing of claim 1 wherein the switchbox distributes power to a sputter gun from at least one pulse direct current (PDC) generator or at least one radio frequency (RF) generator.

9. The system for combinatorial processing of claim 1 wherein each coaxial switch is configured to route power to the plurality of sputter guns via a plurality of output paths from the coaxial switch.

10. The system for combinatorial processing of claim 1 wherein the programmable logic control comprises a power supply exclusion logic configured to selectively enable power delivery connections for specific pairs of corresponding ones of the plurality of generators and the plurality of sputter guns.

11. The system for combinatorial processing of claim 10 wherein the power supply exclusion logic is implemented by a plurality of inverter logic gates and AND logic gates.

12. The system for combinatorial processing of claim 10 wherein the output lines from the power supply exclusion logic are applied to the plurality of coaxial switches in the switchbox to determine each combination of a generator and a sputter gun used in the combinatorial processing of a substrate.

13. The system for combinatorial processing of claim 1 wherein the plurality of coaxial switches in the switchbox form a switching matrix that enables the selection of a generator to use with a sputter gun for a specific combinatorial process.

* * * * *